United States Patent
Ting et al.

(10) Patent No.: US 8,937,426 B2
(45) Date of Patent: Jan. 20, 2015

(54) MANUFACTURING METHOD OF POLARIZING POLYVINYLIDENE FLUORIDE PIEZOELECTRIC FILM WITHOUT METALIZED ELECTRODE AND SYSTEM HAVING THE SAME

(75) Inventors: Yung Ting, Chung Li (TW); Sheuan-Perng Lin, Chung Li (TW); Hariyanto Gunawan, Chung Li (TW)

(73) Assignee: Chung-Yuan Christian University, Tao Yuan County (TW)

( * ) Notice: Subject to any disclaimer, the term of this patent is extended or adjusted under 35 U.S.C. 154(b) by 498 days.

(21) Appl. No.: 13/458,238

(22) Filed: Apr. 27, 2012

(65) Prior Publication Data
US 2013/0175900 A1    Jul. 11, 2013

(30) Foreign Application Priority Data
Jan. 10, 2012   (TW) .............................. 101100982 A

(51) Int. Cl.
*H01L 41/22*    (2013.01)
*H01L 41/18*    (2006.01)
*H01L 41/26*    (2006.01)
*H01L 41/047*   (2006.01)
*H05B 6/00*     (2006.01)

(52) U.S. Cl.
USPC ........... 310/357; 29/25.35; 264/435; 264/436

(58) Field of Classification Search
USPC .................. 310/357; 29/25.35; 264/435, 436
See application file for complete search history.

(56) References Cited

U.S. PATENT DOCUMENTS

| | | | | |
|---|---|---|---|---|
| 5,833,833 A | * | 11/1998 | Dultz et al. | 205/414 |
| 2004/0002176 A1 | * | 1/2004 | Xu | 438/40 |
| 2009/0124838 A1 | * | 5/2009 | Haramoto | 585/25 |

FOREIGN PATENT DOCUMENTS

| | | | | |
|---|---|---|---|---|
| CN | 101045795 A | | 10/2007 | |
| CN | 101221297 A | | 7/2008 | |
| JP | 05-323327 A | * | 12/1993 | ............ G02F 1/1337 |
| WO | WO 98/29853 | | 7/1998 | |

\* cited by examiner

*Primary Examiner* — Thomas Dougherty
(74) *Attorney, Agent, or Firm* — Muncy, Geissler, Olds & Lowe, P.C.

(57) ABSTRACT

A manufacturing method of polarizing polyvinylidene fluoride (PVDF) piezoelectric film without metalized electrode includes providing a polyvinylidene fluoride (PVDF) piezoelectric film that is stretched into β phase; providing two glass substrates having an indium tin oxide (ITO) layer respectively, wherein the PVDF piezoelectric film is located between the two glass substrates, and the two ITO layers are coated located separately on top of and below the PVDF piezoelectric film; and imposing a DC electric field onto two ITO layers, wherein the DC electric field of polarization is 400 to 900 kV/cm approximately.

11 Claims, 9 Drawing Sheets

MANUFACTURING METHOD OF POLARIZING POLYVINYLIDENE FLUORIDE PIEZOELECTRIC FILM WITHOUT METALIZED ELECTRODE AND SYSTEM HAVING THE SAME

BACKGROUND OF THE INVENTION

1. Field of the Invention

Present invention relates to a manufacturing method of a polarizing polyvinylidene fluoride (PVDF) film without metalized electrode and a system having the same.

2. Description of the Related Art

The piezoelectric effect is to exploit material deformation to transform mechanical energy into electrical energy, or to transform electrical energy into mechanical energy. Since the piezoelectric property of barium titanate (BaTiO3) was discovered in 1942, various researches on piezoelectric materials have emerged incessantly.

In the past, most piezoelectric materials were ceramic inorganic materials such as barium titanate and lead zirconate titanate etc. In General, piezoelectric ceramic materials have the features of small volume, rapid response, and low power consumption on displacements, but there are still restrictions on the uses, such as the fragility of the materials. The structure of materials is damaged easily when it bears uneven forces. In recent years, polyvinylidene fluoride (Polyvinylidene, PVDF) which is a representative of polymer organic materials has attracted the most attention. The PVDF piezoelectric material becomes deformed when receiving forces from a certain direction, so the size and direction of the dipole change and the quantity of electric charge therewith change. Then, the voltage is generated.

However, in order to take advantage of the piezoelectric properties of PVDF piezoelectric film, the specific structural PVDF must be polarized by DC high-voltage first, so a certain polarization direction can be generated to obtain piezoelectric properties. Nevertheless, general speaking, when engaging a high-voltage polarization under the limited characteristics of the PVDF material and under conditions of not puncturing and damaging material structure, the higher electric field of polarization is imposed, the better polarization characteristic can be achieved.

In view of the features mentioned above, the purpose of present invention is to provide a different manufacturing method from conventional way of manufacturing polarized PVDF after making metalized electrodes; hence, non-metalized electrodes and imposing higher electric field of polarization can be achieved, so that a better process of making PVDF polarization can be achieved.

SUMMARY OF THE INVENTION

The major purpose of present invention is to provide a manufacturing method for polarized polyvinylidene fluoride (PVDF) piezoelectric film of non-metalized electrode with high pressure resistance, in order to obtain a better polarization and the PVDF piezoelectric film with non-metalized electrode.

Another major purpose of present invention is to provide a polarization system, which can impose higher electric field of polarization on polyvinylidene fluoride (PVDF) piezoelectric film, so better polarization effect can be obtained.

In order to achieve the purpose stated above, present invention provides a manufacturing method of polarizing polyvinylidene fluoride (PVDF) piezoelectric film of non-metalized electrode. The method of present invention is to polarize the polyvinylidene fluoride film that has been stretched to β phase. The manufacturing method includes:

Step S31: providing a polyvinylidene fluoride (PVDF) piezoelectric film which has been stretched into β phase;

Step S32: providing two glass substrates having an indium tin oxide (ITO) layer respectively, wherein the PVDF piezoelectric film is disposed between the two glass substrates, and the two ITO layers are coated located separately on top of the PVDF piezoelectric film and below the PVDF piezoelectric film; and Step S33: imposing a DC electric field so as to polarize for d33 that polarization direction is paralleling to the direction of the thickness of the film. And the DC electric field for polarization is 400 to 900 kV/cm approximately.

The process is better for thin PVDF piezoelectric film, and is more applicable to PVDF piezoelectric film with a thickness of less than 10 microns. Each glass substrate includes a soda lime float glass, and each of the soda lime float glass has a thickness approximately 1.0 millimeter (mm). Each ITO layer has a thickness, and the thickness of the ITO layers is 150 nanometers (nm) approximately. The polarized PVDF piezoelectric film has piezoelectric properties, and the piezoelectric constant is d33; it can reach above 18 pC/N.

According to the present invention, imposing a DC electric field of polarization onto the two ITO layers to complete the polarization of the thickness can be operated at room temperature; however, if it is operated under the condition with higher temperature, a better polarization effect can be achieved.

In addition, present invention also provides a polarization system, which includes: a power supply, a polyvinylidene fluoride (PVDF) film, and two glass substrates. The PVDF piezoelectric film is the polyvinylidene fluoride film that has been stretched into β phase. The two glass substrates have indium tin oxide (ITO) layers respectively; the PVDF piezoelectric film is located between the two glass substrates, and the two ITO layers are coated located separately on top of and below the PVDF piezoelectric film. The power supply is electrically connected to the two ITO layers for imposing a DC electric field for polarization, and the DC electric field is about 400 to 900 kV/cm approximately.

Another embodiment of present invention is merely coating ITO layer on one of the two glass substrates and making the ITO layer with a specified design pattern, and polarizing the surface to obtain the PVDF piezoelectric film with specified polarization of non-metalized electrode in the d31 polarization direction.

DETAILED DESCRIPTION OF THE PREFERRED EMBODIMENTS

In order to make it easier to understand the technical contents of present invention, hereinafter, specific embodiments of present invention are presented below.

Figure 1:
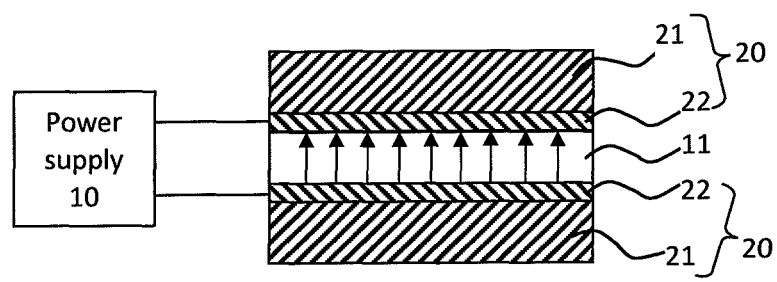
FIG. 1 is the illustration of the polarization system in accordance with the present invention.

Please refer to the polarization system in FIG. 1. The polarization system of the present invention comprises a power supply 10, a polyvinylidene fluoride (PVDF) film 11, and two glass substrates 20. The PVDF piezoelectric film 11 is the polyvinylidene fluoride film that has been stretched into β phase. The two glass substrates 20 have an indium tin oxide (ITO) layer 22 respectively. Preferably, each of the glass substrate 20 comprises a soda lime float glass 21.

The PVDF piezoelectric film 11 is located between the two glass substrates 20, and the two ITO layers 22 are coated located separately on top of the PVDF piezoelectric film 11 and below the PVDF piezoelectric film 11. The power supply 10 is electrically connected to the two ITO layers 22 for imposing a DC electric field so as to polarize in the direction of d33, and the DC electric field is about 400 to 900 kV/cm approximately.

In the preferred embodiments, the PVDF piezoelectric film 11 has a thickness, and the thickness of the PVDF piezoelectric film 11 is less than 10 microns. Each of the soda lime float glass 21 has a thickness with approximately 1.0 millimeter (mm). Each ITO layer 22 has a thickness of about 150 nanometers (nm) approximately.

Figure 2:
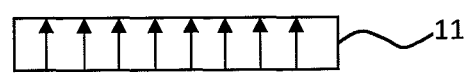
FIG. 2 shows the illustration of the polarized PVDF piezoelectric film.

Please refer to FIG. 2. After polarizing in the direction of the thickness of d33, the two glass substrates are removed. As shown in FIG. 2, the polarized PVDF piezoelectric film which contains piezoelectric property and its piezoelectric constant is d33.

Figure 3:
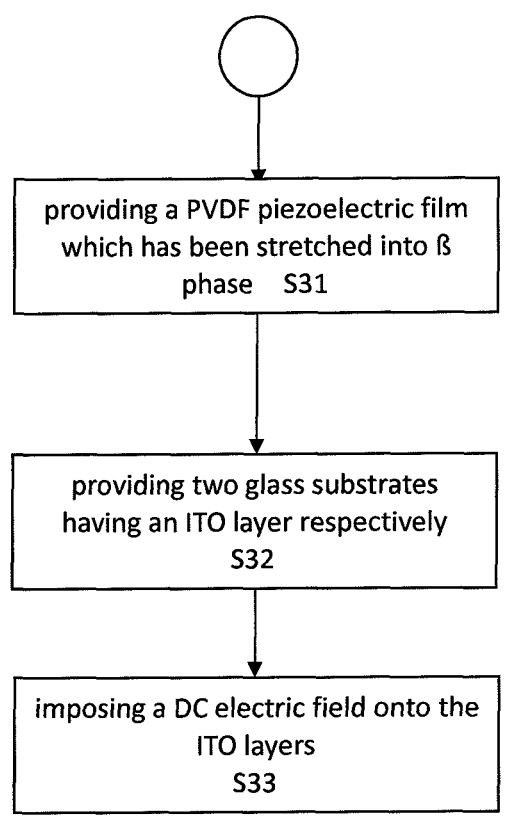
FIG. 3 shows the flow chart of the manufacturing method of polarizaing polyvinylidene fluoride (PVDF) piezoelectric film without metalized electrode.

Please refer to FIG. 3 which is the flow chart of polarizing d33. It shows the manufacturing method of polarization in accordance with the present invention.

The manufacturing method according to the present invention comprises:

S31: providing a polyvinylidene fluoride (PVDF) film 11, wherein the PVDF piezoelectric film is stretched into β phase;

S32: providing two glass substrates 20 having an indium tin oxide (ITO) layer 22 respectively, wherein the PVDF piezoelectric film 11 is disposed between the two glass substrates 20, wherein the two ITO layers 22 are coated located separately on top of and below the PVDF piezoelectric film 11.

S33: imposing a DC electric field onto the two ITO layers 22 for polarization, and the DC electric field is 400 to 900 kV/cm approximately.

Preferably, the PVDF piezoelectric film 11 has a thickness, and the thickness of the PVDF piezoelectric film 11 is less than 10 microns. Each glass substrate 20 comprises a soda lime float glass 21 with a thickness approximately 1.0 millimeter (mm). Each ITO layer 22 has a thickness with about 150 nanometers (nm) approximately. After being polarized, the PVDF piezoelectric film 11 contains piezoelectric property and the piezoelectric constant is d33. The step of imposing the electric field with high-voltage onto the two ITO layers is at regular room temperature; if it is performed under the condition with a higher temperature, better polarization effect can be achieved. The piezoelectric constant d33 can reach above 18 pC/N; the preferred range is 18-25 pC/N.

Figure 4:
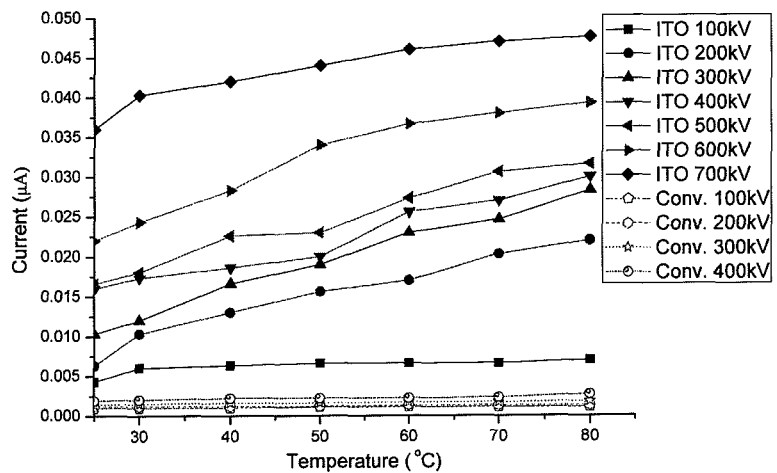
FIG. 4 is a comparison graph on pyroelectric effect between the present invention and the conventional manufacturing method of metalizing electrode before polarizing PVDF piezoelectric film.

Please refer to FIG. 4, which shows the experimental result of the pyroelectric effect of using polarized PVDF piezoelectric film with ITO in accordance with the present invention that is better than the conventional method of using metalized polarization.

Figure 5:
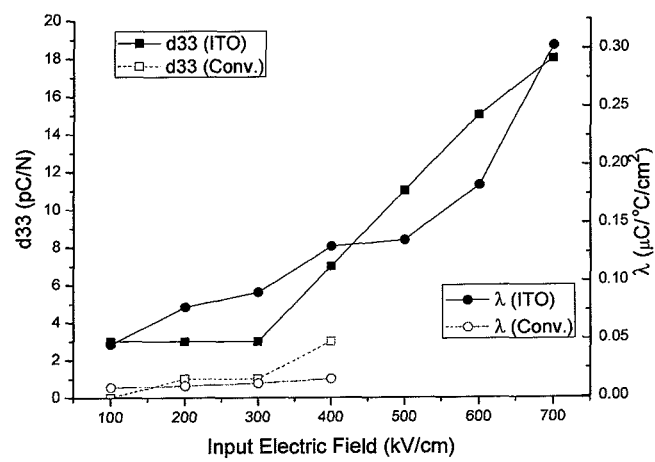
FIG. 5 is a comparison graph on the d33 and coefficient against the imposed electric field between present invention and manufacturing method of metalizing electrode before polarizing PVDF piezoelectric film.

Please refer to FIG. 5, which displays the experimental result of the relational graph of the $d_{33}$ and λ coefficient against the imposed DC electric field, which shows a comparison of the polarization result between present invention and the conventional manufacturing method of using metalized electrode for piezoelectric PVDF. λ coefficient is as, $\lambda=(I/A)dT/dt$ where (I is current, A is the electrode area, and dT/dt is the ratio of the temperature variation). Because the coefficient of the electric charge is $g_{33}=d_{33}/(\epsilon_r\epsilon_0)$, the greater the value of $d_{33}$ is, the greater g33 is. Therefore, the better output of voltage response is achieved.

Figure 6A:
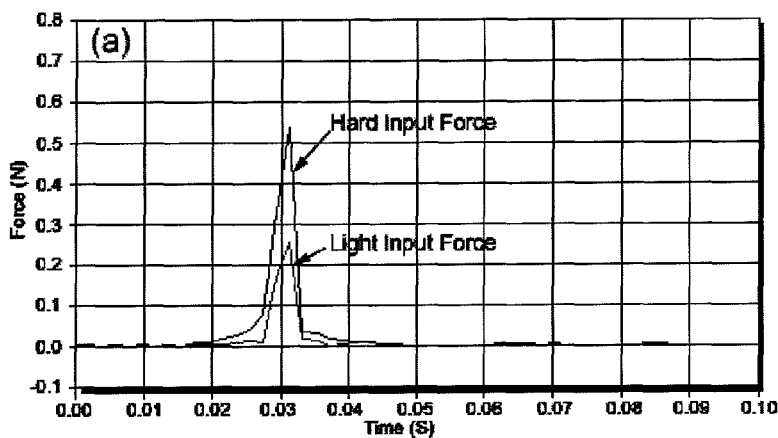
FIG. 6A and FIG. 6B, which are the results, measured by FFT analyzer, of polarized PVDF piezoelectric film using ITO without metalizing electrode.
Figure 6B:
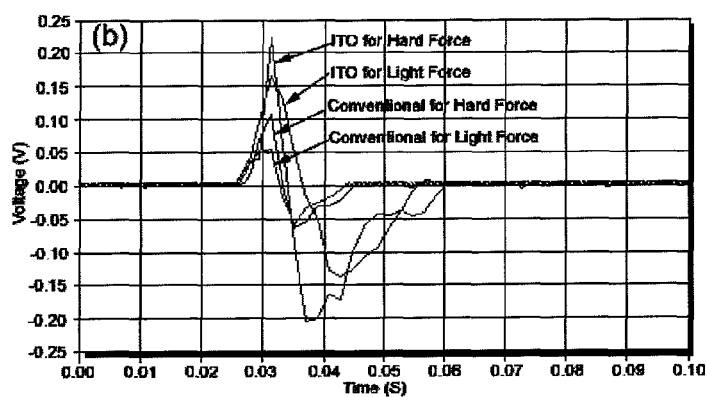

Then, please refer to FIG. 6A and FIG. 6B, which are measured by FFT analyzer and showing the PVDF piezoelectric film with the ITO without metalized electrode for polarization. FIG. 6A shows a relational graph of force and time. FIG. 6B shows the relation of time and voltage value under the condition of applying forces. Therefore, FIG. 6A and FIG. 6B can define the sensitivity of the PVDF piezoelectric film of using ITO for polarization.

Figure 7:
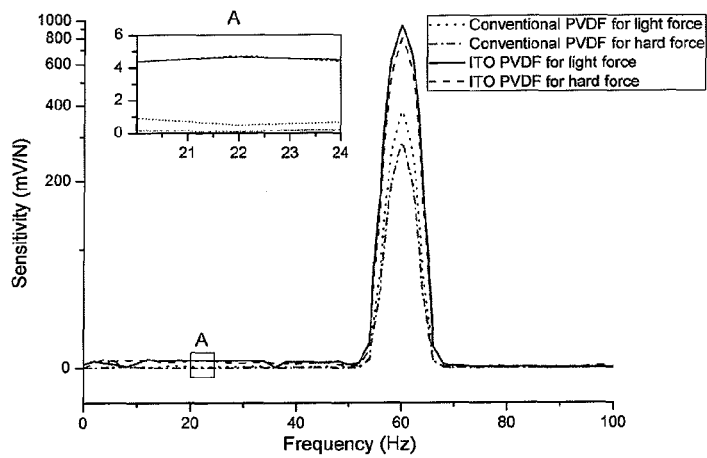
FIG. 7 is a comparison graph showing the relationship of the sensitivity and frequency between the present invention and the conventional process of metalizing electrode before polarizing PVDF piezoelectric film.

FIG. 7 shows the relational graph of sensitivity and frequency. The graph indicates that the sensitivity of the PVDF piezoelectric film with the ITO for polarization is much higher than that of the conventional method of making polarized PVDF piezoelectric film after metalizing electrode.

According to the manufacturing method of the present invention, the polarized PVDF piezoelectric film of d31 without metalized electrode is merely coating the ITO layer on one of the glass substrates, and making the ITO layer electrodes with a specified design pattern, which can be designed depending on the requirements in order to obtain different directions for polarization. As shown in FIG. 8A-8D, the ITO layer 22a, with specified pattern, is coated on the soda lime float glass 21, and the specified pattern shows two combs point at each other. The power supply 10 provides required power to the ITO layers 22a for polarization so a DC electric field is imposed on the surface in the ITO layer 22a for the polarization, wherein the DC electric field is 400 to 900 kV/cm approximately. Please refer to the front view of FIG. 8C and the top view of 8D, which show the two glass substrates are removed after polarization. The polarization direction of the PVDF piezoelectric film 11a is the direction of arrows. It contains piezoelectric property and the piezoelectric constant is d31.

Please refer to FIG. 9A-9D for another variation of the embodiment. The electrodes of the ITO layer 22a with the specified pattern is coated located on soda lime float glass 21, and the specified pattern shows two concentric circles with the concentric circle near the center being a solid circle. The power supply 10 electrically connects to the ITO layer 22b so as to impose the DC electric field for polarization, and the DC electric field of polarization is 400 to 900 kV/cm approximately. Refer to the front view of FIG. 9C and the top view of 9D, which show the two glass substrates are removed after polarization. The polarization direction of the polarized PVDF piezoelectric film 11b is the direction of arrows. It contains piezoelectric property and forms the polarization direction as the d31. With the variation of the polarized electrodes for d31, the PVDF piezoelectric film without metalized electrode can be obtained. The piezoelectric constant d31 can reach above 15 pC/N; the preferred range is 15-20 pC/N, or even higher.

Figure 10:
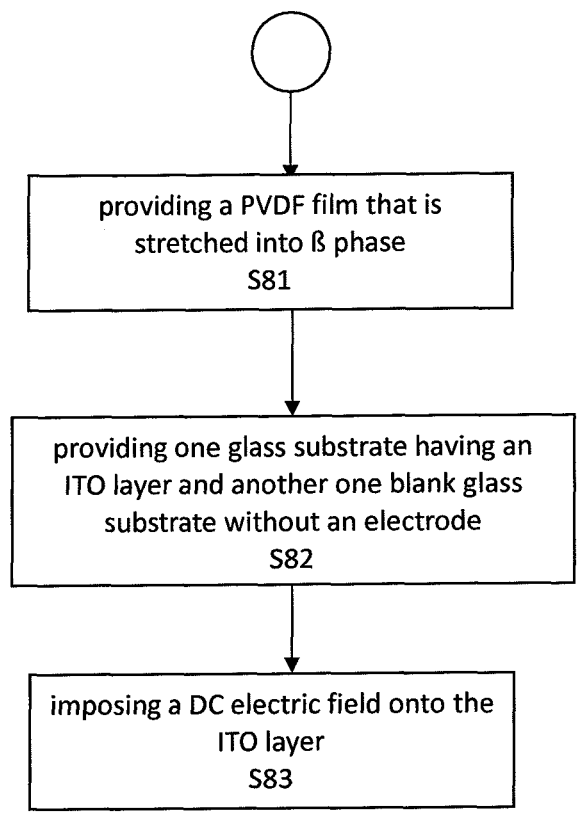
FIG. 10 shows the flow chart of the manufacturing method of surface polarized polyvinylidene fluoride (PVDF) piezoelectric film without metalized electrode in accordance with the present invention.

Please refer to the flow chart of FIG. 10 for d31 surface polarization, which illustrates the manufacturing method of polarization in accordance with the present invention.

Figure 8A:
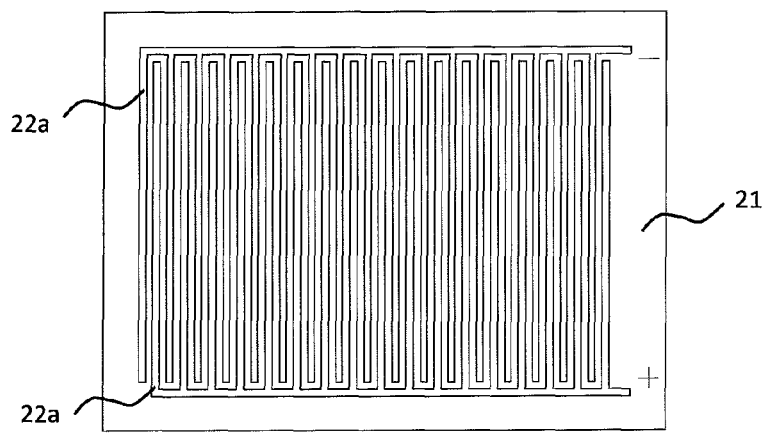
FIG. 8A and FIG. 9A are the other embodiments showing different patterns of polarized electrodes on the ITO layers for various polarization directions.
Figure 8B:
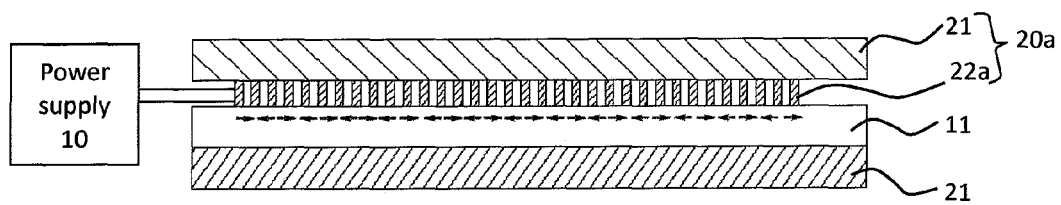
FIG. 8B and FIG. 9B are the illustrations of the polarization systems, based on the patterns of the ITO layers in FIG. 8A and FIG. 9A respectively.
Figure 8C:
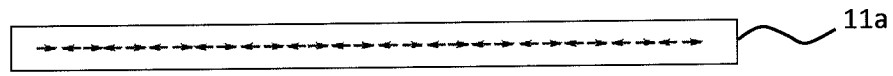
FIG. 8C, 8D and FIG. 9C based on the illustrations in FIG. 8A and FIG. 9A respectively, are the front view of the polarized PVDF piezoelectric film.
Figure 8D:
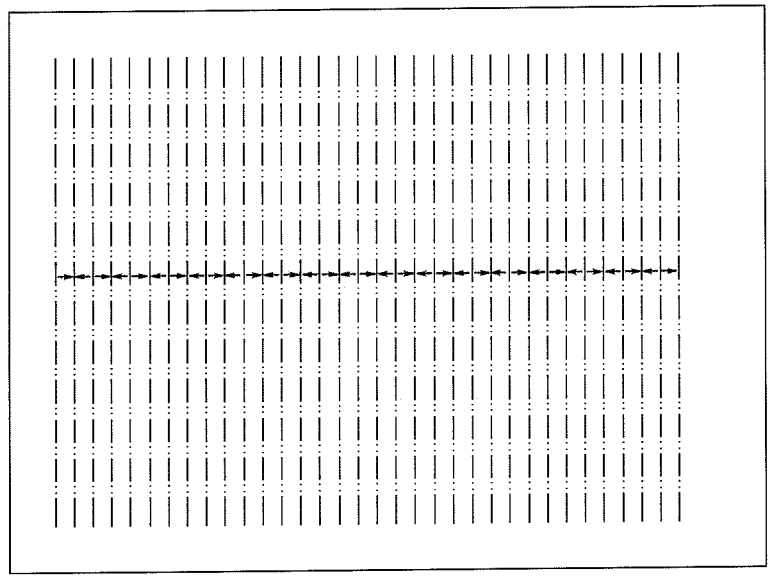
Figure 9A:
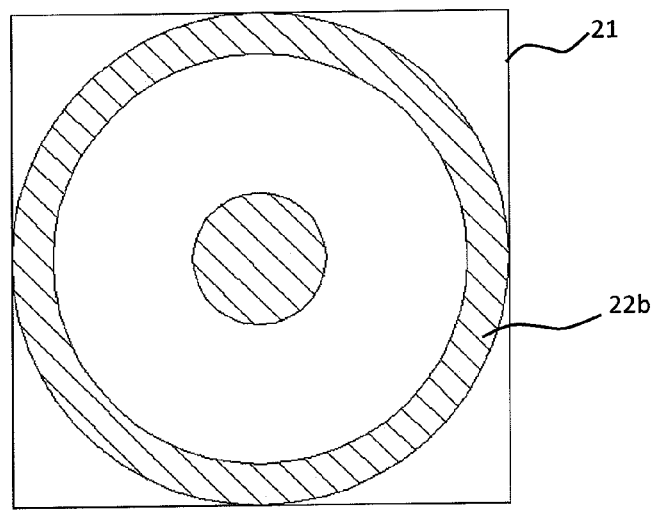
Figure 9B:
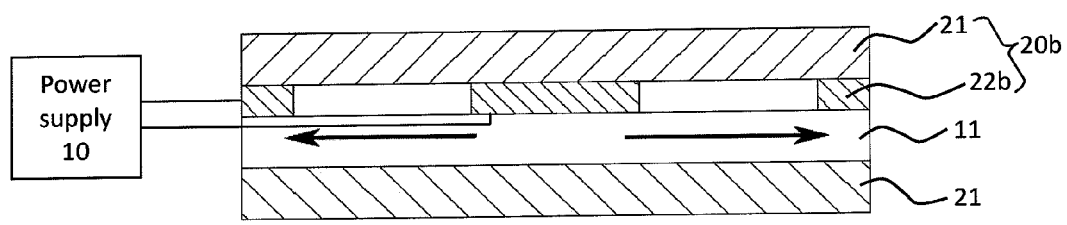
Figure 9C:
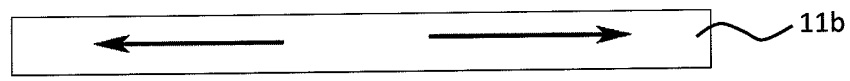
Figure 9D:
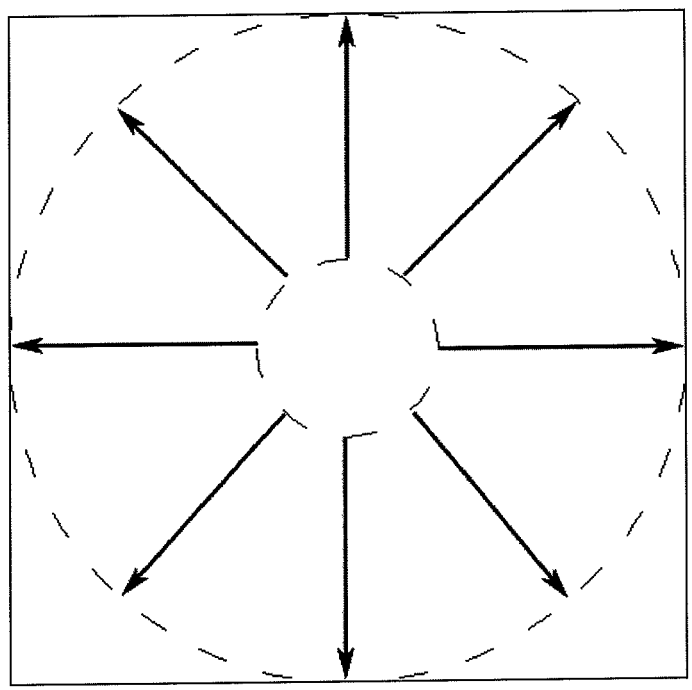
FIG. 9D, based on FIG. 9B, is the top view of the polarized PVDF piezoelectric film.

The manufacturing method in present invention includes:

S81: providing a polyvinylidene fluoride (PVDF) film and the polyvinylidene fluoride film is stretched into β phase;

S82: providing two glass substrates. One of the two glass substrates comprises an indium tin oxide (ITO) layer 22a or 22b, while the other glass substrate yet is blank without an electrode. The PVDF piezoelectric film 11 is located between the two glass substrates, and the ITO layer is coated located on top of the PVDF piezoelectric film, wherein the ITO layer has a specified pattern. And the specified pattern comprises two combs pointing at each other, as shown in FIG. 8A. Alternatively, the specified pattern can be two concentric circles, and the concentric circle near the center is a solid circle, as shown in FIG. 9A.

S83: imposing a DC electric field onto the ITO layer 22 or 22b, and the DC electric field of polarization is 400 to 900 kV/cm approximately.

It is noted that the above-mentioned embodiments are only for illustration. It is intended that the present invention cover modifications and variations of present invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A manufacturing method of polarization without metalized electrode, which comprises:
    providing a polyvinylidene fluoride (PVDF) piezoelectric film that is stretched into β phase;
    providing two glass substrates having an indium tin oxide (ITO) layer respectively, wherein the PVDF piezoelectric film is located between the two glass substrates, and the two ITO layers are coated located separately on top of and below the PVDF piezoelectric film; and
    imposing a DC electric field onto two ITO layers, wherein the DC electric field of polarization is 400 to 900 kV/cm approximately.

2. The manufacturing method as claimed in claim 1, wherein
    each glass substrate comprises a soda lime float glass, and each of the soda lime float glass has a thickness with approximately 1.0 millimeter;
    the thickness of the PVDF piezoelectric film is less than 10 microns; and
    each ITO layer has a thickness with 150 nanometers (nm) approximately.

3. The manufacturing method as claimed in claim 2, the polarized PVDF piezoelectric film has piezoelectric properties with d33 piezoelectric constant above 18 pC/N.

4. A manufacturing method of a polarization without metalized electrode, which comprises:
    providing a polyvinylidene fluoride (PVDF) piezoelectric film that is stretched into β phase;
    providing two glass substrates, wherein one of the two glass substrates comprises an indium tin oxide (ITO) layer, the PVDF piezoelectric film is located between the two glass substrates, and the ITO layer with a specific pattern of two combs pointing at each other is coated located on top of the PVDF piezoelectric film; and
    imposing a DC electric field of polarization onto the ITO layer having the specific pattern, and the DC electric field is 400 to 900 kV/cm approximately.

5. A manufacturing method of polarization without metalized electrode, which comprises:
    providing a polyvinylidene fluoride (PVDF) piezoelectric film that is stretched into β phase;
    providing two glass substrates, wherein one of the two glass substrates comprises an indium tin oxide (ITO) layer, the PVDF piezoelectric film is located between the two glass substrates, and the ITO layers having a specific pattern of two concentric circles with the concentric circle near the center being a solid circle is coated located on top of the PVDF piezoelectric film; and
    imposing a DC electric field of polarization onto the ITO layer, and the DC electric field of polarization is 400 to 900 kV/cm approximately.

6. The manufacturing method as claimed in claim 4, the polarized PVDF piezoelectric film has piezoelectric properties with d31 piezoelectric constant reaching above 18 pC/N.

7. The manufacturing method as claimed in claim 5, the polarized PVDF piezoelectric film has piezoelectric properties with d31 piezoelectric constant reaching above 18 pC/N.

8. A polarization system, comprising:
    a power supply;
    a polyvinylidene fluoride (PVDF) piezoelectric film that is stretched into β phase;
    two glass substrates having an indium tin oxide (ITO) layer respectively, wherein the PVDF piezoelectric film is located between the two glass substrates, and the two ITO layers are coated located separately on top of and below the PVDF piezoelectric film;
    wherein the power supply is electrically connected to the two ITO layers for imposing a DC electric field of polarization, and the DC electric field of polarization is 400 to 900 kV/cm approximately.

9. The polarization system as claimed in claim 8, wherein the PVDF piezoelectric film has a thickness less than 10 microns.

10. The polarization system as claimed in claim 8, wherein each glass substrate comprises a soda lime float glass having a thickness of approximately 1.0 millimeter; and each ITO layer has a thickness of about 150 nanometers approximately.

11. The polarization system as claimed in claim 10, the polarized PVDF piezoelectric film has piezoelectric properties with d33 piezoelectric constant reaching above 18 pC/N.

* * * * *